US008645885B1

(12) United States Patent
Manohararajah et al.

(10) Patent No.: US 8,645,885 B1
(45) Date of Patent: Feb. 4, 2014

(54) SPECIFICATION OF MULTITHREADING IN PROGRAMMABLE DEVICE CONFIGURATION

(71) Applicant: Altera Corporation, San Jose, CA (US)

(72) Inventors: Valavan Manohararajah, Scarborough (CA); David Galloway, Toronto (CA); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/733,994

(22) Filed: Jan. 4, 2013

(51) Int. Cl.
*G06F 17/50* (2006.01)

(52) U.S. Cl.
USPC ............ 716/108; 716/101; 716/113; 716/134

(58) Field of Classification Search
USPC .................................. 716/101, 108, 113, 134
See application file for complete search history.

(56) References Cited

U.S. PATENT DOCUMENTS

| | | | |
|---|---|---|---|
| 5,663,888 A | 9/1997 | Chakradhar | |
| 6,466,898 B1 * | 10/2002 | Chan | 703/17 |
| 7,299,458 B2 * | 11/2007 | Hammes | 717/133 |
| 7,594,195 B2 * | 9/2009 | Jain et al. | 716/124 |
| 8,286,137 B2 * | 10/2012 | Kahlon et al. | 717/126 |
| 8,296,696 B1 | 10/2012 | Chiu et al. | |
| 8,402,408 B1 | 3/2013 | Van Antwerpen et al. | |
| 2002/0162097 A1 * | 10/2002 | Meribout | 717/155 |
| 2004/0068711 A1 | 4/2004 | Gupta et al. | |
| 2008/0276209 A1 | 11/2008 | Albrecht et al. | |
| 2009/0146686 A1 | 6/2009 | Voogel et al. | |
| 2010/0058261 A1 * | 3/2010 | Markov et al. | 716/5 |
| 2012/0227026 A1 * | 9/2012 | Goldman et al. | 716/128 |

OTHER PUBLICATIONS

Betz, V., et al., *Architecture and CAD for Deep-Submicron FPGAs*, Kluwer Academic Publishers, Feb. 1999.
Carloni, L.P., et al., "A Methodology for Correct-by-Construction Latency Insensitive Design", *ICCAD '99: Proceedings of the 1999 IEEE/ACM International Conference on Computer-aided Design*, pp. 309-315, 1999.
Cong, J., et al., "Physical Planning with Retiming", *ICCAD-2000: Proceedings of the 2000 IEEE/ACM International Conference on Computer-aided Design*, pp. 2-7, 2000.
Cormen, T.H., et al., *Introduction to Algorithms*, MIT Press and McGraw Hill, Third Edition, pp. 651-655, 2009.
Dasdan, A., "Experimental Analysis of the Fastest Optimum Cycle Ratio and Mean Algorithms", *ACM Transactions on Design Automation of Electronic Systems*, vol. 9, No. 4, pp. 385-418, Oct. 2004.
Deokar, R.B., et al., "A Fresh Look at Retiming via Clock Skew Optimization", *DAC '95: Proceedings of the 32nd Annual ACM/IEEE Design Automation Conference*, pp. 310-315, 1995.
Hurst, A.P., et al., "Physical Placement Driven by Sequential Timing Analysis", *ICCAD-2004: Proceedings of the 2004 IEEE/ACM International Conference on Computer-aided Design*, pp. 379-386, 2004.

(Continued)

*Primary Examiner* — Naum Levin
(74) *Attorney, Agent, or Firm* — Ropes & Gray LLP; Jeffrey H. Ingerman (57) ABSTRACT

A method of configuring a programmable integrated circuit device with a user logic design includes accepting a first user input defining the user logic design, accepting a second user input defining multithreading characteristics of at least a portion the user logic design, determining a configuration of the programmable integrated circuit device having the user logic design, multithreading the at least a portion of the configuration based on the second user input, and retiming the multithreaded configuration.

19 Claims, 6 Drawing Sheets

(56) References Cited

OTHER PUBLICATIONS

Leiserson, C.E., et al., "Retiming Synchronous Circuitry", Digital Equipment Corporation, Aug. 20, 1986, published in *Algorithmica*, vol. 6, No. 1, pp. 5-35, Jun. 1991.

Maheshwari, N., et al., *Timing Analysis and Optimization of Sequential Circuits*, Springer, pp. 9, 14-17, 1998.

Manohararajah, V., et al., "Heuristics for Area Minimization in LUT-Based FPGA Technology Mapping", *IEEE Transactions on CAD*, vol. 25, No. 11, pp. 2331-2340, Nov. 2006.

Singh, D.P., et al., Integrated Retiming and Placement for Field Programmable Gate Arrays, *FPGA'02: ACM International Symposium on Field Programmable Gate Arrays*, pp. 67-76, Feb. 2002.

Weaver, N., et al., "Post-Placement C-Slow Retiming for the Xilinx Virtex FPGA", *FPGA '03: ACM International Symposium on Field Programmable Gate Arrays*, pp. 185-194, Feb. 2003.

Weaver, N., et al., "The Effects of Datapath Placement and C-Slow Retiming on Three Computational Benchmarks" *FCCM'02: The 10th Annual IEEE Symposium on Field-Programmable Custom Computing Machines*, pp. 303-306, Feb. 2003.

Eguro, K., "Supporting High-Performance Pipelined Computation in Commodity-Style FPGAs", University of Washington doctoral dissertation, pp. 1-168 (2008).

Li, S., et al., "QuickRoute: A Fast Routing Algorithm for Pipelined Architectures", *2004 IEEE International Conference on Field-Programmable Technology* pp. 73-80 (2004).

Sharma, A., et al., "PipeRoute: A Pipelining-Aware Router for FPGAs", *FPGAs '03: Proceedings of the 2003 ACM/SIGDA eleventh international symposium on Field programmable gate arrays*, pp. 68-77 (Feb. 23-25, 2003).

Singh, D., et al., "The Case for Registered Routing Switches in Field Programmable Gate Arrays", *FPGA '01: Proceedings of the 2001 ACM/SIGDA ninth international symposium on Field programmable gate arrays*, pp. 161-169.(Feb. 11-13, 2001).

Tsu, W., et al., "HSRA: High-Speed, Hierarchical Synchronous Reconfigurable Array", *FPGA '99: Proceedings of the 1999 ACM/SIGDA seventh international symposium on Field programmable gate arrays*, pp. 125-134 (1999).

\* cited by examiner

FIG. 1

```
set_global_assignment -name MIN_CORE_JUNCTION_TEMP 0
set_global_assignment -name MAX_CORE_JUNCTION_TEMP 85
set_global_assignment -name DEVICE_FILTER_SPEED_GRADE FASTEST
set_global_assignment -name ERROR_CHECK_FREQUENCY_DIVISOR 256
set_global_assignment -name VERILOG_FILE xor6.v
set_global_assignment -name VERILOG_FILE crcwrap.v
set_global_assignment -name VERILOG_FILE crcdump.v
set_global_assignment -name OPTIMIZE_HOLD_TIMING "ALL PATHS"
set_global_assignment -name MULTITHREAD_BY 4 -to crcwrap -name crcwrap_mt
set_global_assignment -name MULTITHREAD_BY 4 -to crcdump -name crcdump_mt
set_global_assignment -name MULTITHREAD_BY 4 -to crosb -name crossb_mt_a
set_global_assignment -name MULTITHREAD_BY 4 -to crosb -name crossb_mt_b
```

FIG. 2

```
module crcwrap /* synthesis multithread_by 4 */ (
    input clk,
    input [127:0] datai,
    output [127:0] datao
);

...

endmodule
```

FIG. 3

```
module crosb
/* synthesis multithread_by 4 -name crosb_mt_a */
/* synthesis multithread_by 4 -name crosb_mt_b */
(
    input clk,
    input [127:0] datai,
    output [127:0] datao
);

...

endmodule
```

FIG. 4

```
primitive_multithread_entry inst_entry #(RATE=4) (
    .clki(clk0),
    .clko(clk1),
    .datai(datai),
    .datao(ent_data)
);

do_something_interesting inst_interesting (
    .clk(clk1),
    .datai(ent_data),
    .datao(ext_data)
);

primitive_multithread_exit inst_exit #(RATE=2) (
    .clki(clk1),
    .clko(clk2),
    .datai(ext_data),
    .datao(datao)
);
```

SPECIFICATION OF MULTITHREADING IN PROGRAMMABLE DEVICE CONFIGURATION

FIELD OF THE INVENTION

This invention relates to configuration software for programmable integrated circuit devices such as field-programmable gate array (FPGAs) or other types of programmable logic devices (PLDs), and particularly to a user interface for specifying, to configuration software adapted for configuring such devices, the provision of multithreading in user logic designs for such devices.

BACKGROUND OF THE INVENTION

Early programmable devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

While it may have been possible to configure the earliest programmable logic devices manually, simply by determining mentally where various elements should be laid out, it was common even in connection with such earlier devices to provide programming software that allowed a user to lay out logic as desired and then translate that logic into a configuration for the programmable device. With current larger devices, it would be impractical to attempt to lay out the logic without such software.

Some user logic designs would be able to operate at higher clock speeds if the designs could be retimed—e.g., by inserting pipeline registers at various locations in the designs. One form of retiming may include multithreading. However, multithreading frequently changes the functionality of a circuit design. Therefore, configuration software does not attempt multithreading when implementing a user logic design, because it has no way of recognizing when multithreading would not affect the functionality of the user logic design.

SUMMARY OF THE INVENTION

Several different methods for specifying to configuration software the ability of different portions of a user logic design to be multithreaded without affecting functionality are provided. Once this information is provided to the configuration software, the software can take the information into account to attempt to maximize the operating speed of the device configured with the user logic design.

Therefore, in accordance with the present invention there is provided a method of configuring a programmable integrated circuit device with a user logic design. The method includes accepting a first user input defining the user logic design, accepting a second user input defining multithreading characteristics of at least a portion the user logic design, determining a configuration of the programmable integrated circuit device having the user logic design, multithreading the at least a portion of the configuration based on the second user input, and retiming the multithreaded configuration.

A machine-readable data storage medium encoded with instructions for carrying out such a method also is provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Programmable integrated circuit device configuration software can use various techniques to optimize performance of a programmable integrated circuit device by modifying the cycle-by-cycle behavior of a user logic design. Retiming is an example of an optimization that takes advantage of register positioning flexibility to minimize the length of register-to-register paths, without changing the functionality of the underlying circuitry of the device. Other more powerful transformations that improve performance require altering the underlying circuitry.

One type of user logic design in which retiming may be limited is a design including both unidirectional or feed-forward logic paths, and cyclic or looped logic paths. Although such a user logic design can be retimed by inserting registers in the unidirectional logic path (it being assumed that the device in which the design is being implemented is provided with sufficient registers to place as needed), inserting registers in the cyclic portions would affect the relative timing of the unidirectional and cyclic logic paths, and therefore would change the functionality of the overall user logic design. Accordingly, efforts to retime such user logic designs have heretofore focused on the unidirectional portions of the designs, leaving the cyclic portions of the designs as speed-limiting portions, or using other techniques to speed up operation of the cyclic logic.

However, certain types of cyclic logic may be amenable to being converted to multithreaded logic. As a simple example, a loop that continually adds two new input numbers together on each cycle could be recast as multithreaded logic that adds two numbers, with different inputs on each thread. Rather than being adversely affected by the insertion of additional registers, increasing the number of registers in the loop allows for further fine tuning of the register placements within the loop thereby speeding up the operation of the loop logic. At the same time, other types of looped logic are not amendable to multithreading.

Figure 1:
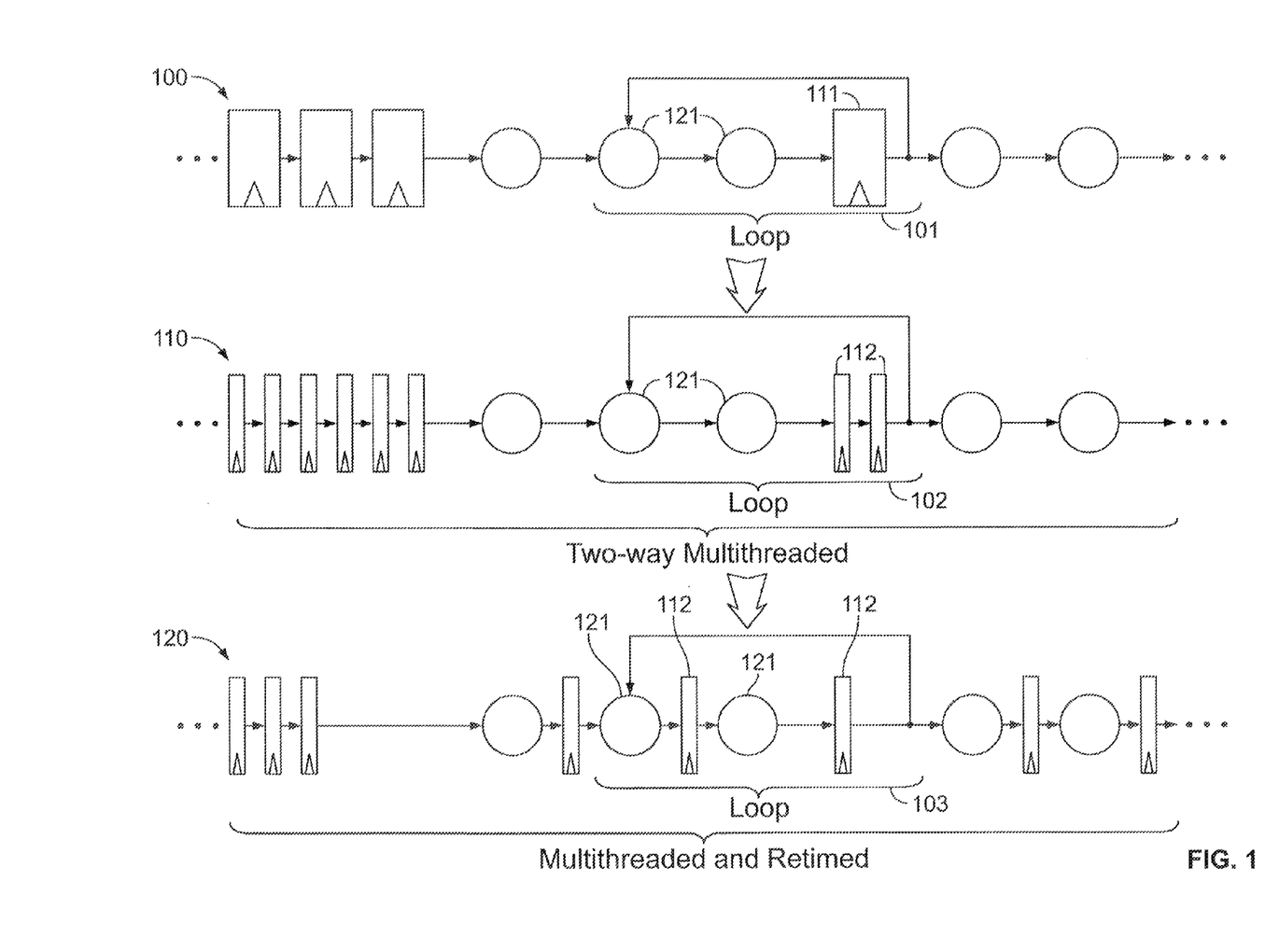
FIG. 1 is a schematic illustration of multithreading and retiming of logic in accordance with embodiments of the present invention.

For example, circuit (or circuit portion) 100 of FIG. 1 includes a loop 101 including one register 111, as well as logic nodes 121. Although the remainder of circuit 100 could be retimed by adding registers, the operation of loop 101 would be changed by addition of registers. However, as shown, assuming that the function of loop 101 is amenable to multithreading, circuit 100 could be converted to multi-threaded circuit 110.

Circuit 110 is "two-way" multithreaded, meaning that it operates, on alternating clock cycles, on two completely independent data streams, with the inactive data stream being held in registers in the circuit. Thus, the number of registers in circuit 110 is twice that in circuit 100, because each register in circuit 100 must still exist for the current data, while the data in the inactive data stream is held in the additional registers. By tripling, instead of doubling, the number of registers (not shown), the circuit could be three-way multithreaded, operating on three independent data streams—one on every third clock cycle, with the inactive data streams in the two additional sets of registers. Higher numbers of threads also may be provided (not shown).

As seen in FIG. 1, in circuit 110, the single register 111 has become two registers 112 in loop portion 102. The logic in circuit 110 is amenable to retiming even in portion 102. As seen in FIG. 1, in retimed loop 103 of retimed circuit 120, one of registers 112 has been moved from after nodes 121 to between nodes 121.

Programmable device configuration software has heretofore had no way of knowing whether or not a particular portion of logic is amenable to multithreading, and therefore has not been able to use multithreading in the manner just described as a way to optimize user logic designs. Where a user logic design, or a portion thereof, is amenable to multithreading, programmable device configuration software cannot take advantage of multithreading unless it is made aware that the design, or the portion of the design, is amenable to multithreading. Embodiments of the present invention provide various options to users to specify that the design, or the portion of the design, is amenable to multithreading.

Figure 2:
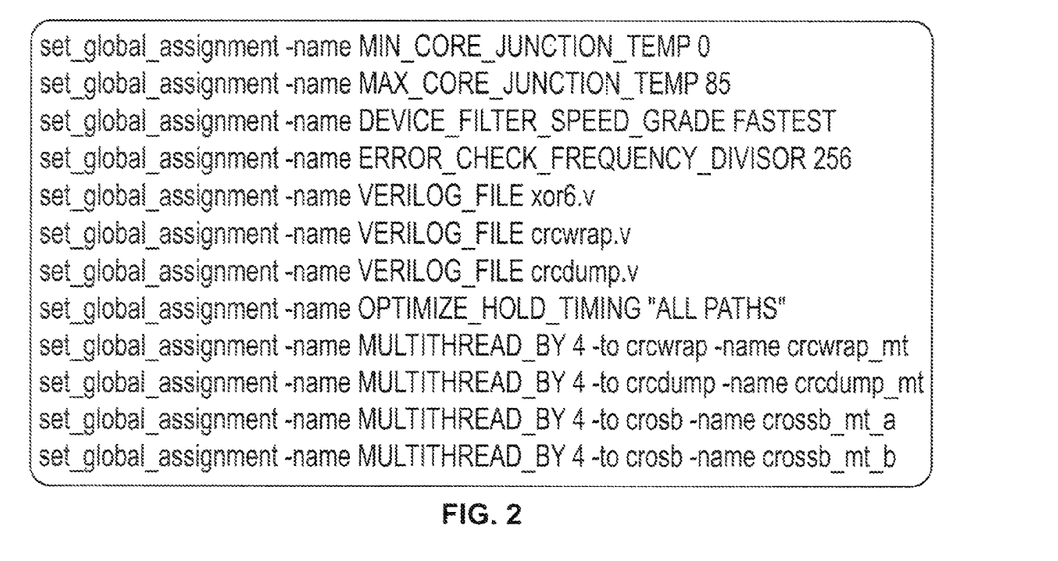
FIG. 2 represents a text-file including hardware description language in which multithreaded modules in a device are specified in a declaration format.

Some embodiments include enhancements to the hardware-description language (HDL) statements—such as VHDL or Verilog—used to configure a programmable device. For example, the HDL statements in FIG. 2 represent a text-file-based approach for specifying the details of various logic modules in a user configuration. These statements embody a mechanism, included in configuration software according to embodiments of the invention, to indicate whether a portion of the user configuration includes portions that are amenable to multithreading, meaning that the configuration software may add registers to that portion.

In the example shown in FIG. 2, in addition to the normal declaration statements for various modules, the four final statements establish four modules each of which is multi-threaded by 4 (and renamed, in this case, by adding _mt to indicate that the module has been multithreaded). The system would also establish four ports by which the various instances of each module may be accessed. While each of the first two of those statements establishes multithreaded versions of separate modules "crcwrap" and "crcdump," each of the final two statements creates four multithreaded instances of the same module "crosb," rather than having one statement that creates eight instances. This may be done in a case where four instances are required in one location on the device, while the other four instances are required in another location on the device. For all multithreaded modules, although not shown, the configuration software may assign a numerical (or other ordinal) suffix (e.g., crcwrap_mt_1, crcwrap_mt_2, etc.) to the name of the module, so that individual instances can be kept track of.

The modules being multithreaded may encounter some additional latency for data entering and leaving each respective module, as there may be some rate conversion circuitry instantiated to multiplex the input data streams at multiple ports into a single high-speed data stream, and to demultiplex output data arriving as a single high-speed data stream into multiple output streams.

Each of the foregoing "declaration"-type commands, which are shown above as text statements, can also be implemented through a graphical user interface in configuration software that has such an interface.

Figure 3:
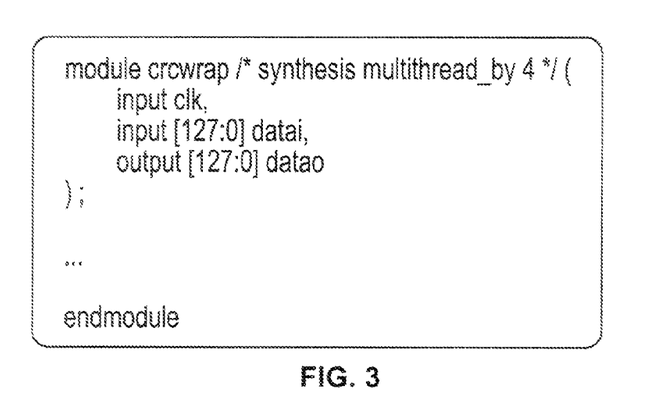
FIG. 3 represents a text-file including hardware description language in which multithreaded modules in a device are specified through a comment-command format.

Another way of specifying whether a module is amenable to multithreading—rather than a declaration-type command—is to include the specification directly in the HDL statements that establish the module. Many HDL synthesis tools are able to understand special directives embedded in comments within the HDL file. This mechanism can be used to provide a way of specifying to the configuration software whether a module is amenable to multithreading. FIG. 3 is an example of HDL (in this case, Verilog) statements that establish a module that is whether a module is amenable to multi-threading, with the relevant comment beginning with a keyword that the compiler recognizes as indicating a command, and then the command itself follows.

Figure 4:
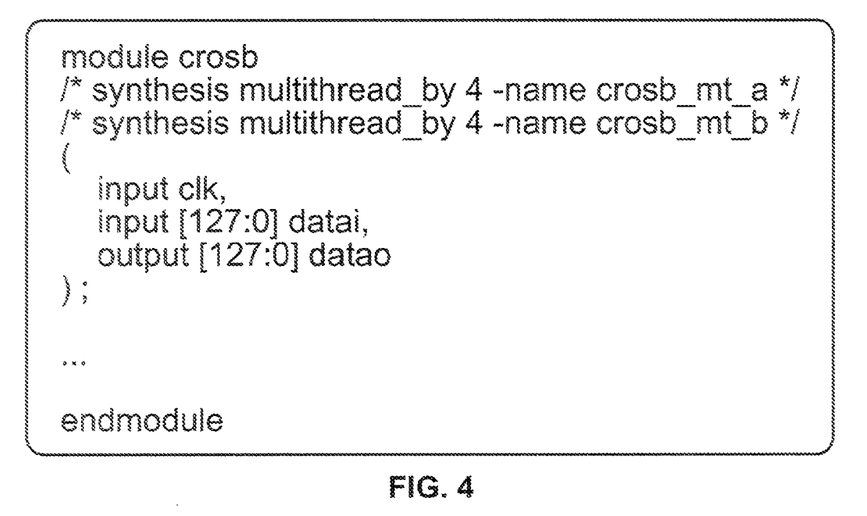
FIG. 4 represents a text-file including hardware description language in which multiple instances of multithreaded modules in a device are specified through a comment-command format.

The example in FIG. 3 produces four visible instances of crcwrap named crcwrap_1, crcwrap_2, crcwrap_3, and crcwrap_4, while internally only one multithreaded version of crcwrap is implemented. If multiple multithreaded instances of a module are needed, names and additional multithreading directions can be added. For example, in FIG. 4, two instances of module crosb are created. The first is named crosb_mt_a and is multithreaded by four, and the second is named crosb_mt_b and is also multithreaded by four, although it also is possible to specify that the two instances are multithreaded by different amounts.

Specification of a module as amenable to multithreading in the HDL statements that establish the module can be used either alone, or as a supplement to the declaration-type commands described earlier. However, for a module that occurs more than once, each occurrence that is to be multithreaded must be separately specified as multithreaded.

Some versions of configuration software may not support the embedding of commands within HDL comments. In such a case, primitives can be provided. For example, the HDL may support entry and exit primitives that can be instantiated in a user logic design around regions of logic that are being multithreaded. In such a case, the user may have control over the clocks used for the entry and exit blocks as well as the clocks used by the multithreaded logic.

Figure 5:
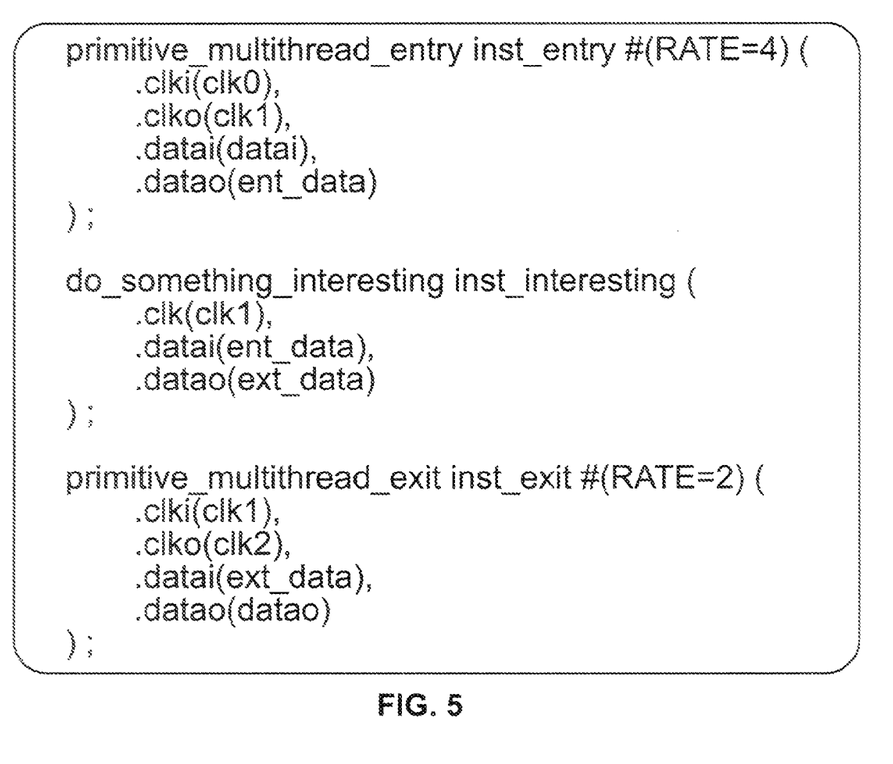
FIG. 5 represents hardware description language establishing a portion of a device and specifying through instantiation of a primitive that that portion is multithreaded.

As an example of this approach, FIG. 5 shows the instantiation of primitives that indicate that the module "do_something_interesting" is being wrapped with entry and exit blocks. The entry block specifies that data is being transferred from a domain driven by clk0 into a multithreaded region driven by clk1. The conversion rate is also specified. Four bits of datai are being time-multiplexed onto every bit of ent_data. The module "do_something_interesting" will be multithreaded by the same rate as specified by the entry block. The exit block specifies the rate at which the multithreaded outputs are converted into regular outputs. This rate could be different from the entry or multithreaded rate if the output is to be processed in a different way than the way the inputs were generated.

Figure 6:
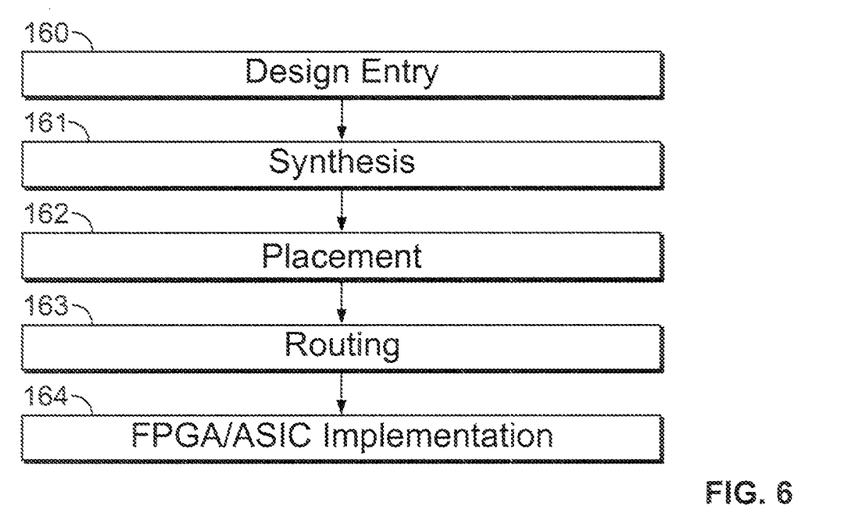
FIG. 6 shows a known programmable device configuration design flow.
Figure 7:
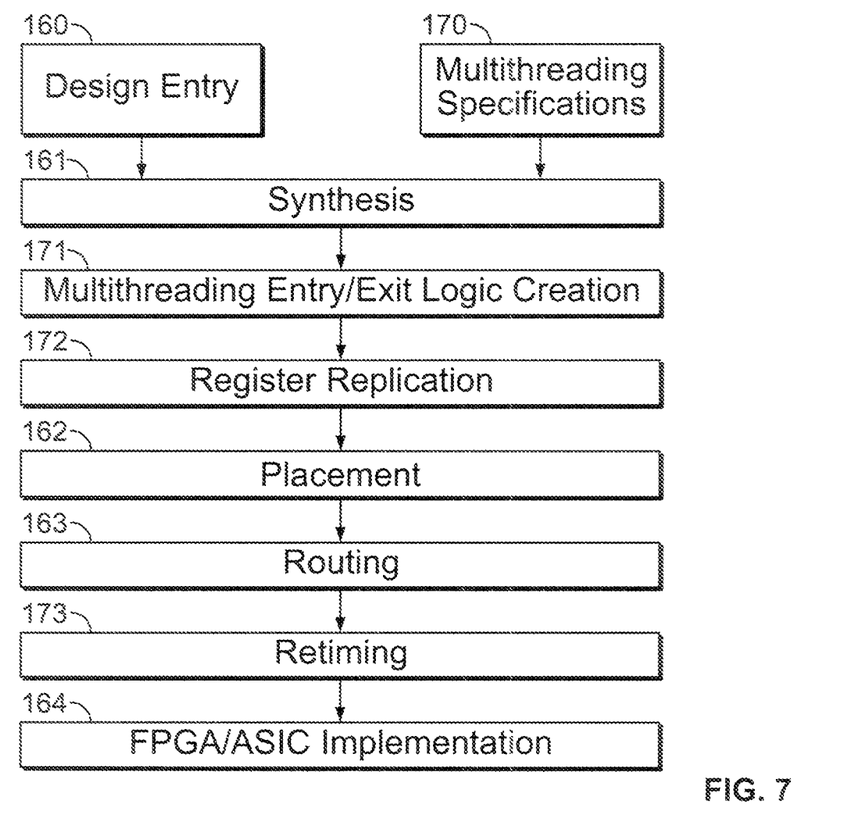
FIG. 7 shows a programmable device configuration design flow in accordance with embodiments of the invention.

There are several ways in which programmable device configuration software, running on a suitable processor such a personal computer or workstation, can process the specifications, entered by a user in accordance with the foregoing discussion, of whether particular logic is amenable to multithreading. One example is illustrated in FIGS. 6 and 7. FIG. 6 is a standard design flow that begins with design entry 160 and goes through the steps of synthesis 161, placement 162 and routing 163 before producing the final implementation 164 of the user logic design in the target device. In accordance with embodiments of the invention, the design flow of FIG. 6 can be modified as shown in FIG. 7. Along with design entry 160, the user enters multithreading specifications 170. Multithreading entry/exit logic creation 171 now follows synthesis 161, inserting entry hardware that usually involves serializing a parallel data stream, and exit hardware that usually involves deserializing a serial data stream. Register replication 172 follows to ensure that each thread has its own state registers (i.e., to add the additional registers shown in FIG. 1 where multithreading has occurred). Following routing 163, retiming 173 is added, in which the registers added at 172 may be moved around the design to optimize circuit timing, before the design is output at 164.

Thus it is seen that programmable device configuration software that allows a user to specify information regarding whether logic is amenable to multithreading, and then can use that information to optimize a user logic design, and a corresponding method, have been provided.

Instructions for carrying out a method according to this invention for programming a programmable device may be encoded on a machine-readable medium, to be executed by a suitable computer or similar device to implement the method of the invention for programming or configuring PLDs or other programmable devices. For example, a personal computer may be equipped with an interface to which a PLD can be connected, and the personal computer can be used by a user to program the PLD using suitable software tools as described above.

Figure 8:
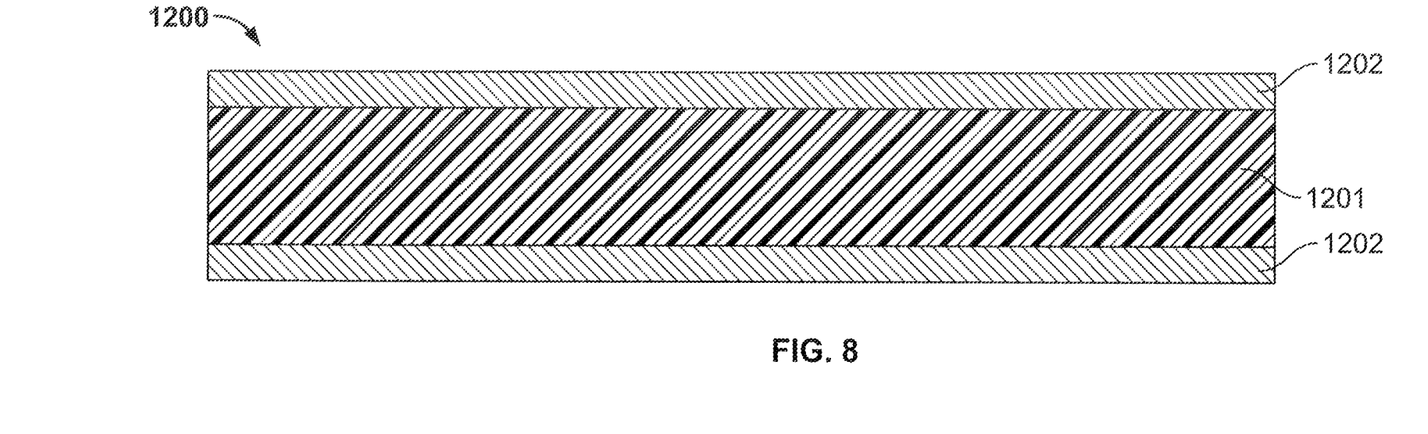
FIG. 8 is a cross-sectional view of a magnetic data storage medium encoded with a set of machine-executable instructions for performing the method according to the present invention.

FIG. 8 presents a cross section of a magnetic data storage medium 1200 which can be encoded with a machine executable program that can be carried out by systems such as the aforementioned personal computer, or other computer or similar device. Medium 1200 can be a floppy diskette or hard disk, or magnetic tape, having a suitable substrate 1201, which may be conventional, and a suitable coating 1202, which may be conventional, on one or both sides, containing magnetic domains (not visible) whose polarity or orientation can be altered magnetically. Except in the case where it is magnetic tape, medium 1200 may also have an opening (not shown) for receiving the spindle of a disk drive or other data storage device.

The magnetic domains of coating 1202 of medium 1200 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 9:
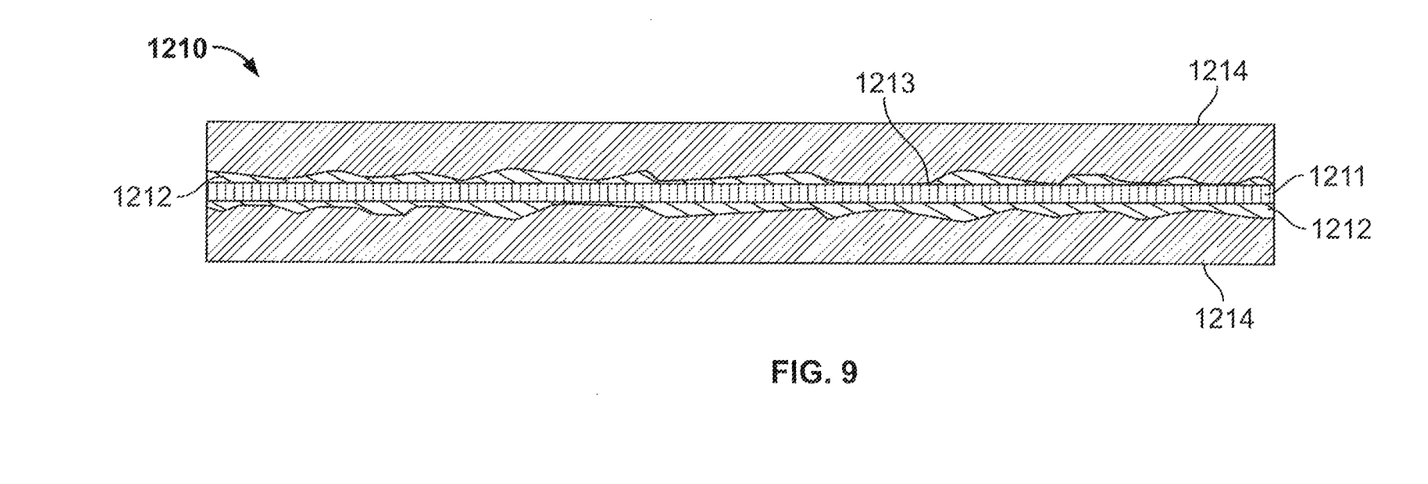
FIG. 9 is a cross-sectional view of an optically readable data storage medium encoded with a set of machine executable instructions for performing the method according to the present invention.

FIG. 9 shows a cross section of an optically-readable data storage medium 1210 which also can be encoded with such a machine-executable program, which can be carried out by systems such as the aforementioned personal computer, or other computer or similar device. Medium 1210 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1210 preferably has a suitable substrate 1211, which may be conventional, and a suitable coating 1212, which may be conventional, usually on one or both sides of substrate 1211.

In the case of a CD-based or DVD-based medium, as is well known, coating 1212 is reflective and is impressed with a plurality of pits 1213, arranged on one or more layers, to encode the machine-executable program. The arrangement of pits is read by reflecting laser light off the surface of coating 1212. A protective coating 1214, which preferably is substantially transparent, is provided on top of coating 1212.

In the case of magneto-optical disk, as is well known, coating 1212 has no pits 1213, but has a plurality of magnetic domains whose polarity or orientation can be changed magnetically when heated above a certain temperature, as by a laser (not shown). The orientation of the domains can be read by measuring the polarization of laser light reflected from coating 1212. The arrangement of the domains encodes the program as described above.

A PLD 140 programmed or configured according to the present invention may be used in many kinds of electronic devices. One possible use is in a data processing system 1400 shown in FIG. 10. Data processing system 1400 may include one or more of the following components: a processor 1401; memory 1402; I/O circuitry 1403; and peripheral devices 1404. These components are coupled together by a system bus 1405 and are populated on a circuit board 1406 which is contained in an end-user system 1407.

Figure 10:
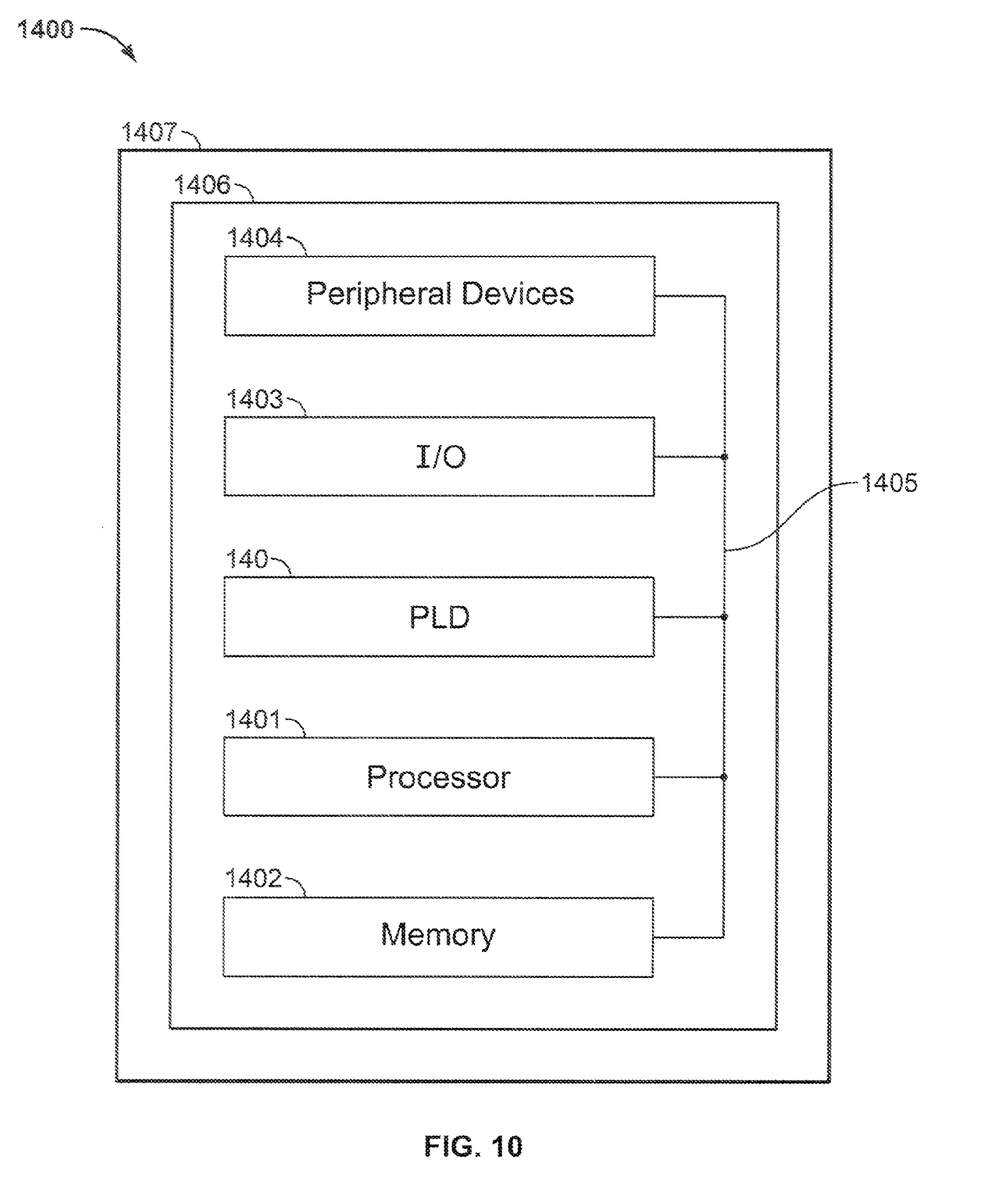
FIG. 10 is a simplified block diagram of an illustrative system employing a programmable logic device configured in accordance with the present invention.

System 1400 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 140 can be configured as a processor or controller that works in cooperation with processor 1401. PLD 140 may also be used as an arbiter for arbitrating access to a shared resources in system 1400. In yet another example, PLD 140 can be configured as an interface between processor 1401 and one of the other components in system 1400. It should be noted that system 1400 is only exemplary, and that the true scope and spirit of the invention should be indicated by the following claims.

Various technologies can be used to implement PLDs 140 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of using a computer to configure a programmable integrated circuit device with a user logic design, said method comprising:
   accepting into said computer a first user input defining said user logic design;
   accepting into said computer a second user input defining availability of multithreading for at least a portion said user logic design;
   determining, using said computer, a configuration of said programmable integrated circuit device having said user logic design;
   using said computer to multithread said at least a portion of said configuration based on said second user input; and
   using said computer to retime said multithreaded configuration.

2. The method of claim 1 wherein said accepting into said computer a second user input comprises accepting into said computer a second user input that also defines a degree of multithreading.

3. The method of claim 2 wherein said accepting into said computer a second user input comprises accepting into said computer a second user input that also defines a name for each multithreaded logic module.

4. The method of claim 1 wherein said accepting into said computer a second user input comprises accepting into said computer a second user input that also defines multiple multithreaded instances of a logic module.

5. The method of claim 4 wherein said accepting into said computer a second user input comprises accepting into said computer a second user input that also defines a name for each instance of the multithreaded logic module.

6. The method of claim 1 wherein said accepting into said computer a second user input comprises accepting entry of said second user input in a graphic interface on said computer.

7. The method of claim 1 wherein said accepting into said computer a second user input comprises accepting entry of said second user input in a text interface on said computer.

8. The method of claim 7 wherein said second user input is entered into said computer as a comment in a hardware description language.

9. The method of claim 7 wherein said second user input is entered into said computer as a hardware description language primitive.

10. The method of claim 1 further comprising using said computer to load said retimed configuration into memory of a programmable integrated circuit device.

11. A non-transitory machine readable storage medium encoded with instructions for performing a method of configuring a programmable integrated circuit device with a user logic design, said instructions comprising:
    instructions to accept a first user input defining said user logic design;
    instructions to accept a second user input defining availability of multithreading for at least a portion said user logic design;
    instructions to determine a configuration of said programmable integrated circuit device having said user logic design;
    instructions to multithread said at least a portion of said configuration based on said second user input; and
    instructions to retime said multithreaded configuration.

12. The non-transitory machine readable storage medium of claim 11 wherein said instructions to accept a second user input comprise instructions to accept a second user input that also defines a degree of multithreading.

13. The non-transitory machine readable storage medium of claim 12 wherein said instructions to accept a second user input comprise instructions to accept a second user input that also defines a name for each multithreaded logic module.

14. The non-transitory machine readable storage medium of claim 11 wherein said instructions to accept a second user input comprise instructions to accept a second user input a that also defines multiple multithreaded instances of a logic module.

15. The non-transitory machine readable storage medium of claim 14 wherein said instructions to accept a second user input comprise instructions to accept a second user input that also defines a name for each instance of the multithreaded logic module.

16. The non-transitory machine readable storage medium of claim 11 wherein said instructions to accept a second user input comprise instructions to accept entry of said second user input in a graphic interface.

17. The non-transitory machine readable storage medium of claim 11 wherein said instructions to accept a second user input comprise instructions to accept entry of said second user input in a text interface.

18. The non-transitory machine readable storage medium of claim 17 wherein said instructions to accept a second user input comprise instructions to interpret a comment in a hardware description language.

19. The non-transitory machine readable storage medium of claim 17 wherein said instructions to accept a second user input comprise instructions to interpret a hardware description language primitive.

* * * * *